United States Patent
Hu et al.

(10) Patent No.: US 10,141,224 B2
(45) Date of Patent: Nov. 27, 2018

(54) MANUFACTURING METHOD OF INTERCONNECTION STRUCTURE

(71) Applicant: Unimicron Technology Corp., Taoyuan (TW)

(72) Inventors: Dyi-Chung Hu, Hsinchu County (TW); Yin-Po Hung, Hsinchu County (TW); Ra-Min Tain, Hsinchu County (TW); Yu-Hua Chen, Hsinchu (TW)

(73) Assignee: Unimicron Technology Corp., Taoyuan (TW)

( * ) Notice: Subject to any disclaimer, the term of this patent is extended or adjusted under 35 U.S.C. 154(b) by 11 days.

(21) Appl. No.: 15/821,666

(22) Filed: Nov. 22, 2017

(65) Prior Publication Data

US 2018/0096889 A1    Apr. 5, 2018

Related U.S. Application Data

(62) Division of application No. 14/644,197, filed on Mar. 10, 2015, now Pat. No. 9,859,159.

(51) Int. Cl.

| H01L 21/768 | (2006.01) |
|---|---|
| H01L 23/498 | (2006.01) |
| H01L 21/48 | (2006.01) |
| H01L 23/48 | (2006.01) |

(52) U.S. Cl.
CPC ...... *H01L 21/76879* (2013.01); *H01L 21/486* (2013.01); *H01L 21/76898* (2013.01); *H01L 23/481* (2013.01); *H01L 23/49827* (2013.01)

(58) Field of Classification Search
CPC ............ H01L 21/76879; H01L 23/481; H01L 21/76898; H01L 23/49827; H01L 21/486; H01L 2224/16225; H01L 2224/32225; H01L 2224/73204; H01L 2924/00; H01L 2924/15311
USPC ............ 257/774, E21.575, 21.597, E21.627, 257/E21.641
See application file for complete search history.

(56) References Cited

U.S. PATENT DOCUMENTS

| 2010/0038800 A1* | 2/2010 | Yoon ................. H01L 21/76898 257/774 |
| 2010/0244241 A1* | 9/2010 | Marimuthu ........... H01L 21/561 257/737 |
| 2013/0161824 A1* | 6/2013 | Choi ................. H01L 21/76898 257/774 |
| 2013/0241080 A1* | 9/2013 | Pagaila ................. H01L 21/486 257/774 |

(Continued)

*Primary Examiner* — Jonathan Han
(74) *Attorney, Agent, or Firm* — JCIPRNET

(57) ABSTRACT

An interconnection structure and a manufacturing method thereof are provided. The method includes the following steps. First, a substrate having a first surface and a second surface opposite to each other is provided. Then, a conductive through via extended from the first surface to the second surface is formed in the substrate. Then, a portion of the substrate is removed from the first surface to expose a portion of the conductive through via. Then, a dielectric layer is formed on the substrate, and the dielectric layer covers the exposed conductive through via. Then, an opening is formed in the dielectric layer, wherein the opening exposes a portion of the conductive through via, and the top surface of the conductive through via protrudes from the bottom surface of the opening. Then, a conductive layer is formed in the opening.

6 Claims, 4 Drawing Sheets

(56) References Cited

U.S. PATENT DOCUMENTS

2013/0277851 A1* 10/2013 Lin .................. H01L 21/76802
                                                    257/773

* cited by examiner

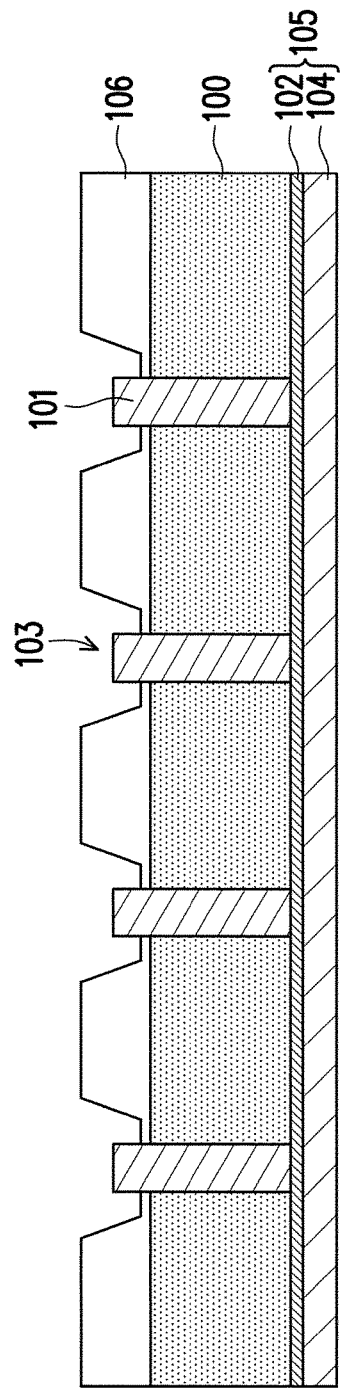
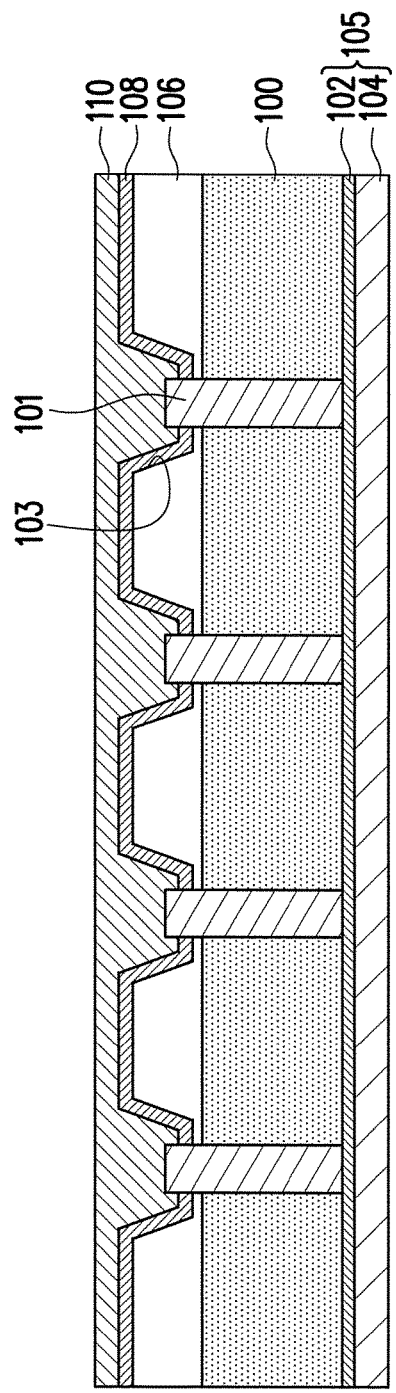

MANUFACTURING METHOD OF INTERCONNECTION STRUCTURE

CROSS-REFERENCE TO RELATED APPLICATION

This application is a divisional application of U.S. application Ser. No. 14/644,197, filed on Mar. 10, 2015, now allowed. The entirety of the above-mentioned patent application is hereby incorporated by reference herein and made a part of this specification.

BACKGROUND OF THE INVENTION

Field of the Invention

The invention relates to an interconnection structure and a manufacturing method thereof, and more particularly, to an interconnection structure having better conductivity and a manufacturing method thereof.

Description of Related Art

In the current manufacturing process of an interconnection structure, a through hole is generally first formed in a substrate, and then an electroplating process is performed to form a conductive material in the through hole so as to manufacture a conductive through via. Then, a circuit pattern connected to the conductive through via is formed on the substrate.

However, in the electroplating process, if the process time is too long, oxidation often occurs in the formed conductive layer. As a result, resistance of the interconnection structure is increased, and therefore the conductivity of the interconnection structure is reduced and the reliability of the interconnection structure is reduced.

SUMMARY OF THE INVENTION

The invention provides an interconnection structure having better conductivity.

The invention provides a manufacturing method of an interconnection structure capable of manufacturing an interconnection structure having better conductivity.

The invention provides a manufacturing method of an interconnection structure including the following steps. First, a substrate having a first surface and a second surface opposite to each other is provided. Then, a conductive through via extended from the first surface to the second surface is formed in the substrate. Then, a portion of the substrate is removed from the first surface to expose a portion of the conductive through via. Then, a dielectric layer is formed on the substrate, and the dielectric layer covers the exposed conductive through via. Then, an opening is formed in the dielectric layer, wherein the opening exposes a portion of the conductive through via, and the top surface of the conductive through via protrudes from the bottom surface of the opening. Then, a conductive layer is formed in the opening.

According to a manufacturing method of an interconnection structure of an embodiment of the invention, after a portion of the substrate is removed from the first surface, the top surface of the conductive through via is, for instance, higher than the first surface by 1 μm to 50 μm.

According to a manufacturing method of an interconnection structure of an embodiment of the invention, the method of removing a portion of the substrate from the first surface includes, for instance, performing a wet etching process.

According to a manufacturing method of an interconnection structure of an embodiment of the invention, the method of forming the opening includes, for instance, performing a laser drilling process or performing a patterning process.

According to a manufacturing method of an interconnection structure of an embodiment of the invention, the method of forming the conductive layer includes the following steps. First, a seed layer is formed on a dielectric layer. Then, an electroplating process is performed to form a conductive material layer on the seed layer, wherein the conductive material layer is completely filled in the opening. Then, a portion of the conductive material layer is removed and the conductive material layer located in the opening is kept, so as to form the conductive layer.

According to a manufacturing method of an interconnection structure of an embodiment of the invention, before a portion of the substrate is removed from the first surface, a protective layer is further formed on a second surface.

According to a manufacturing method of an interconnection structure of an embodiment of the invention, after the conductive layer is formed, the protective layer is further removed.

The invention provides an interconnection structure including a substrate, a conductive through via, a dielectric layer, and a conductive layer. The substrate has a first surface and a second surface opposite to each other. The conductive through via is disposed in the substrate and extended from the first surface beyond the second surface. The dielectric layer is disposed on the substrate, wherein the dielectric layer has an opening exposing a portion of the conductive through via. The top surface of the conductive through via protrudes from the bottom surface of the opening. The conductive layer is disposed in the opening and connected to the conductive through via.

According to an interconnection structure of an embodiment of the invention, the top surface of the conductive through via is higher than the first surface by 1 μm to 50 μm.

According to an interconnection structure of an embodiment of the invention, the substrate is, for instance, a glass substrate, a silicon substrate, a ceramic substrate, or a silicon carbide substrate.

Based on the above, in the invention, the conductive through via protruding from the substrate is first formed in the substrate, and after the dielectric layer is laminated, the opening exposing a portion of the conductive through via is formed, and then the conductive layer used as the circuit pattern is formed in the opening. As a result, the contact area of the conductive through via and the circuit pattern can be increased, such that the conductivity of the interconnection structure is increased and reduction in the reliability of the interconnection structure is prevented.

Several exemplary embodiments accompanied with figures are described in detail below to further describe the disclosure in details.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1A to FIG. 1H are cross-sectional schematics of a manufacturing process of an interconnection structure illustrated according to an embodiment of the invention.

DESCRIPTION OF THE EMBODIMENTS

FIG. 1A to FIG. 1H are cross-sectional schematics of a manufacturing process of an interconnection structure illustrated according to an embodiment of the invention. First, referring to FIG. 1A, a substrate 100 is provided. The substrate 100 has a surface 100a and a surface 100b opposite to each other. The substrate is, for instance, a glass substrate, a silicon substrate, a ceramic substrate, or a silicon carbide substrate. Then, conductive through vias 101 are formed in the substrate 100. Each conductive through via 101 is extended from the surface 100a to the surface 100b. That is, each conductive through via 101 passes through the substrate 100. The method of forming the conductive through vias 101 includes, for instance, first performing a laser drilling process to form through holes in the substrate 100. Then, an electroplating process is performed to form a conductive layer in the through holes. The material of the conductive layer is, for instance, copper, tungsten, aluminum, or an alloy thereof. Alternatively, after the through holes are formed, a plughole process can also be performed to fill a conductive material in the through holes. The conductive material is, for instance, conductive adhesive. In the present embodiment, the size, the location, and the number of the conductive through vias 101 are only exemplary, and the invention is not limited thereto. The location, the number, and the size of the conductive through vias can be changed as needed.

Figure 1A:
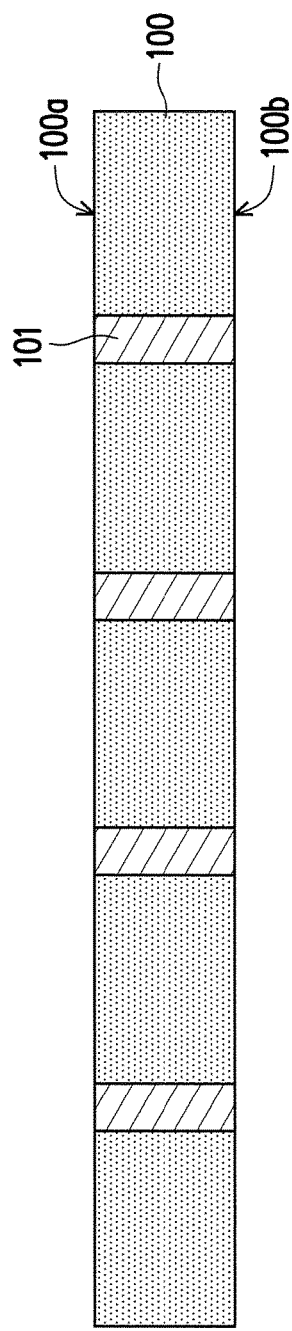
Figure 1B:
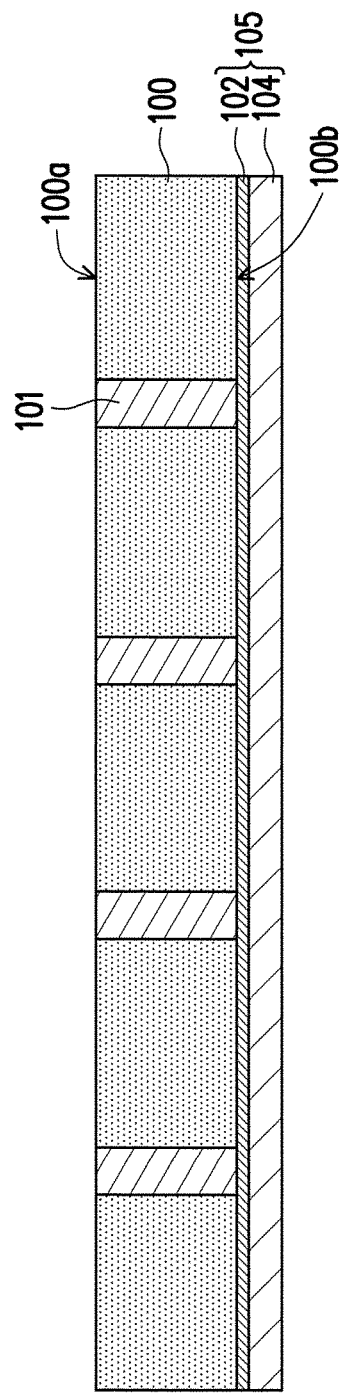

Then, referring to FIG. 1B, a protective layer 105 is optionally formed on the surface 100b of the substrate 100. The protective layer 105 can prevent damage to the surface 100b of the substrate 100 in a subsequent process or prevent any treatment to the surface 100b of the substrate 100. In the present embodiment, the protective layer 105 is formed by seed layers 102 and 104. The method of forming the protective layer 105 includes, for instance, first forming the seed layer 102 on the surface 100b of the substrate 100, and then forming the seed layer 104 on the seed layer 102. The method of forming the seed layers 102 and 104 include, for instance, sputtering or electroplating. The material of the seed layer 102 is, for instance, titanium, tantalum, or chromium, and the material of the seed layer 104 is, for instance, copper. In the present embodiment, the seed layer 102 can be used as an adhesive layer to effectively adhere the substrate 100 and the seed layer 104. In the present embodiment, the thickness of the seed layer 102 is, for instance, between 50 nm and 200 nm, and the thickness ratio of the seed layer 102 and the seed layer 104 can be between 1:2 and 1:3. Moreover, in other embodiments, only the seed layer 102 may be formed according to actual needs.

Figure 1C:
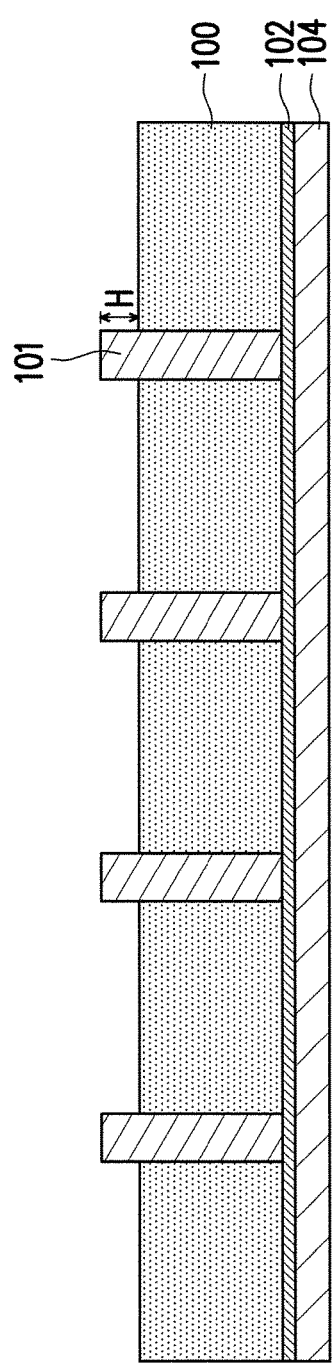

Then, referring to FIG. 1C, a portion of the substrate 100 is removed to expose a portion of each of the conductive through vias 101. The method of removing a portion of the substrate 100 includes, for instance, performing a wet etching process. The etching solution used in the wet etching process is, for instance, hydrofluoric acid. In the present embodiment, the protective layer 105 on the surface 100b can protect the surface 100b of the substrate 100 from being etched by the etching solvent. After a portion of the substrate 100 is removed from the surface 100a, a height difference H between the top surface of each of the conductive through vias 101 and the surface 100a is, for instance, between 1 μm and 50 μm.

Figure 1D:
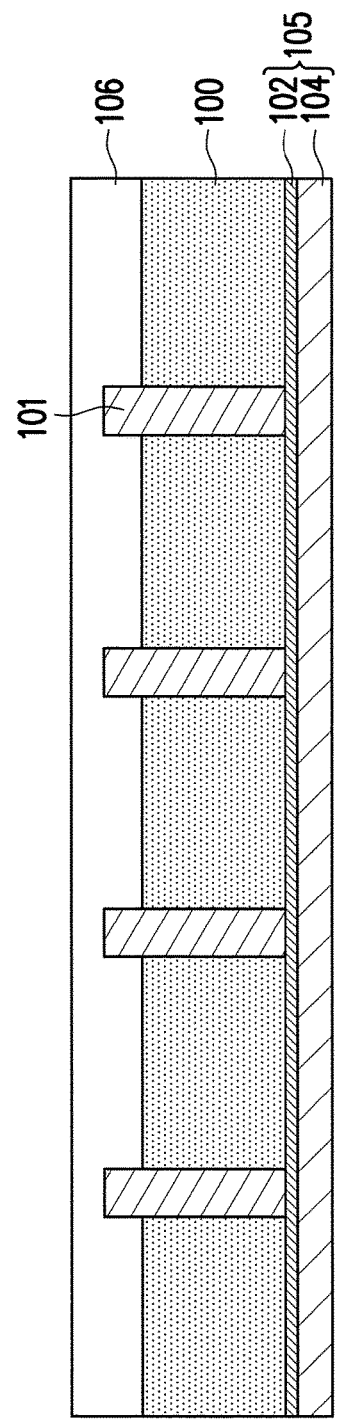

Then, referring to FIG. 1D, a dielectric layer 106 is formed on the substrate 100. The dielectric layer 106 covers the exposed conductive through hole 101. The material of the dielectric layer 106 is, for instance, an oxide, an Ajinomoto build-up (ABF) film, or a semi-cured resin. The dielectric layer 106 is, for instance, formed on the surface 100a of the substrate 100 via a method of lamination or deposition.

Then, referring to FIG. 1E, openings 103 are formed in the dielectric layer 106. The method of forming the openings 103 includes, for instance, performing a laser drilling process. In other embodiments, a patterning process can also be performed to form the openings 103. The patterning process includes, for instance, first forming a mask layer on the dielectric layer 106, and the mask layer defines the locations of the openings 103 to be formed. Then, an etching process is performed by using the mask layer as an etch mask to remove a portion of the dielectric layer 106 so as to form the openings 103. Then, the mask layer is removed. Each opening 103 exposes a portion of the corresponding conductive through via 101, and the top surface of each of the conductive through vias 101 protrudes from the bottom surface of each of the openings 103. In the present embodiment, after the openings 103 are formed in the dielectric layer 106, the dielectric layer 106 still covers the substrate 100. In other words, the openings 103 do not expose the surface 100a of the substrate 100. The openings 103 are the regions in which a circuit pattern is formed in a subsequent process. In the present embodiment, the shapes and the sizes of the openings 103 are both the same, but the invention is not limited thereto, and the shapes and the sizes of the openings can be changed as needed to form the desired circuit pattern.

After the openings 103 are formed, a circuit pattern is formed in the openings 103. The manufacturing method of the circuit pattern is as described in the following FIG. 1F and FIG. 1G. Referring to FIG. 1F, a seed layer 108 is formed on the dielectric layer 106. The method of forming the seed layer 108 includes, for instance, a chemical plating process or a sputtering process. The material of the seed layer 108 is, for instance, copper. Then, an electroplating process is performed to form a conductive material layer 110 on the seed layer 108, and the conductive material layer 110 is completely filled in the openings 103. The material of the conductive material layer 110 is, for instance, copper.

Figure 1G:
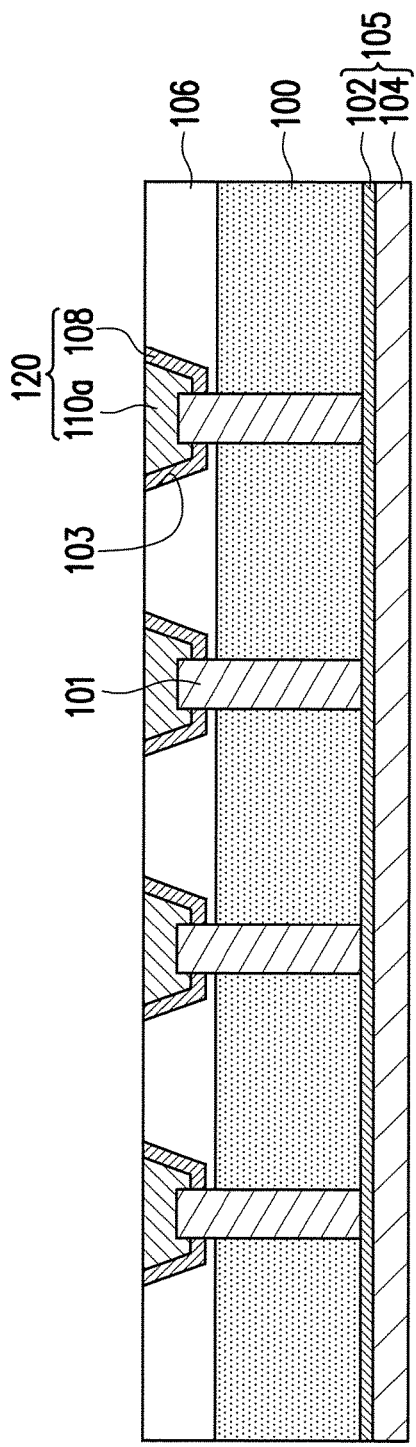

Then, referring to FIG. 1G, a portion of the conductive material layer 110 and a portion of the seed layer 108 are removed by using the top surface of the dielectric layer 106 as the end of the removal until the top surface of the dielectric layer 106 is exposed, and the conductive material layer 110 located in the openings 103 is kept to form a conductive material layer 110a. The manufacture of the interconnection structure of the present embodiment is thus complete. The seed layer 108 and the conductive material layer 110a located in the openings 103 form a conductive layer 120. The method of removing a portion of the conductive material layer 110 and a portion of the seed layer 108 includes, for instance, a chemical mechanical polishing method. In the present embodiment, the conductive through vias 101 protrude from the bottom surfaces of the openings 103 and the top surfaces of the conductive through vias 101 are not coplanar with the bottom surfaces of the openings 103. As a result, the contact area of each of the conductive through via 101 and the conductive layer 120 can be increased, and therefore the conductivity of the interconnection structure can be increased and reduction in the reliability of the interconnection structure can be prevented.

Figure 1H:
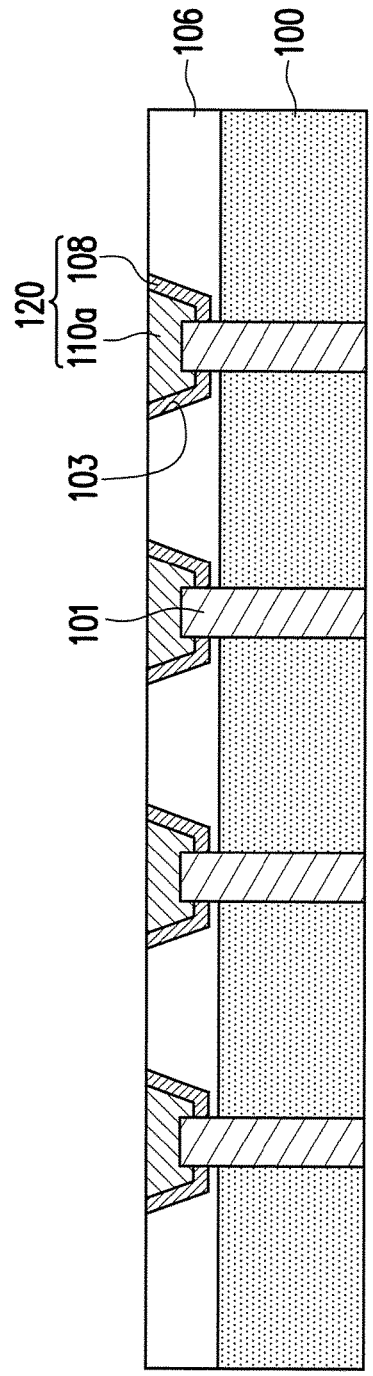

Moreover, the protective layer 105 can be further removed according to actual needs to perform a subsequent process. As shown in FIG. 1H, after the conductive layer 120 is formed, the protective layer 105 is further removed. The method of removing the protective layer 105 includes, for instance, performing a wet etching process or a chemical mechanical polishing process.

Moreover, in the present embodiment, the protective layer 105 is formed on the surface 100b of the substrate 100, but the invention is not limited thereto. In other embodiments, the protective layer 105 can also not be formed on the surface 100b. In this way, the process steps of FIG. 1C to FIG. 1G can also be performed on the surface 100b of the substrate 100 at the same time so as to form the interconnection structure of the present embodiment at two sides of the substrate 100.

Based on the above, during the process of manufacturing the interconnection structure of the invention, a portion of the substrate in which the conductive through vias are formed is first removed to expose a portion of each of the conductive through vias. Then, after the dielectric layer is formed, the openings exposing a portion of each of the conductive through vias are formed, and then the conductive layer used as the circuit pattern is formed in the openings. Since the conductive through vias protrudes from the bottom surfaces of the openings, the contact area of the conductive layer and each of the conductive through vias can be increased, such that the conductivity of the interconnection structure is increased and reduction in the reliability of the interconnection structure can be prevented.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A manufacturing method of an interconnection structure, comprising:
providing a substrate;
forming a conductive through via in the substrate, wherein the substrate has a first surface and a second surface opposite to each other, and the conductive through via is extended from the first surface to the second surface;
removing a portion of the substrate from the first surface to expose a portion of the conductive through via;
forming a dielectric layer on the substrate, wherein the dielectric layer covers the exposed conductive through via;
forming an opening in the dielectric layer, wherein the opening exposes a portion of the conductive through via, and a top surface of the conductive through via protrudes from a bottom surface of the opening; and
forming a conductive layer in the opening, wherein the conductive layer comprises a seed layer and a conductive material layer and top surfaces of the seed layer and the conductive material layer are respectively aligned with a top surface of the dielectric layer,
wherein a method of forming the conductive layer comprises:
forming the seed layer on the dielectric layer;
performing an electroplating process to form the conductive material layer on the seed layer, wherein the opening is completely filled with the conductive material layer; and
removing a portion of the conductive material layer and keeping the conductive material layer located in the opening to form the conductive layer.

2. The method of claim 1, wherein after a portion of the substrate is removed from the first surface, the top surface of the conductive through via is higher than the first surface by 1 μm to 50 μm.

3. The method of claim 1, wherein a method of removing a portion of the substrate from the first surface comprises performing a wet etching process.

4. The method of claim 1, wherein a method of forming the opening comprises performing a laser drilling process or performing a patterning process.

5. The method of claim 1, further comprising, before a portion of the substrate is removed from the first surface, forming a protective layer on the second surface.

6. The method of claim 5, further comprising, after the conductive layer is formed, removing the protective layer.

* * * * *